(12) United States Patent
Kang et al.

(10) Patent No.: US 7,057,462 B2
(45) Date of Patent: Jun. 6, 2006

(54) TEMPERATURE COMPENSATED ON-CHIP BIAS CIRCUIT FOR LINEAR RF HBT POWER AMPLIFIERS

(75) Inventors: Li-Hung Kang, Gilbert, AZ (US); Howard W. Patterson, Phoenix, AZ (US); Zhongian Yuan, Lake Zurich, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 28 days.

(21) Appl. No.: 10/857,040

(22) Filed: May 28, 2004

(65) Prior Publication Data

US 2005/0264363 A1    Dec. 1, 2005

(51) Int. Cl.
*H03F 3/04* (2006.01)
(52) U.S. Cl. .................... 330/289; 330/285
(58) Field of Classification Search ............. 330/289, 330/285, 296, 288; 323/315, 316
See application file for complete search history.

(56) References Cited

U.S. PATENT DOCUMENTS

| 4,990,864 | A | * | 2/1991 | Kwan | 330/288 |
| 6,492,874 | B1 | * | 12/2002 | Shih | 330/288 |
| 6,922,107 | B1 | * | 7/2005 | Green | 330/296 |

OTHER PUBLICATIONS

Jarvinen, Esko, et al, "Bias Circuits for GaAs HBT Power Amplifiers," IREE MTT-S 2001 International Microwave Symposium Digest, IEEE, 5 pp.

* cited by examiner

*Primary Examiner*—Henry Choe

(57) ABSTRACT

An RF amplifier is disclosed having a first and second current mirror module. The first and second current mirror modules each provide current to affect the quiescent bias current of the RF amplifier.

21 Claims, 3 Drawing Sheets

ID OF THE DISCLOSURE

The present disclosure relates generally to electrical circuits, and more particularly to the biasing of an amplifier.

BACKGROUND

Integrated Heterojunction Bipolar Transistor (HBT) power amplifier bias circuits are usually realized as current mirrors which typically have a temperature dependence, causing quiescent bias currents in the RF devices to vary. It is possible to configure the bias circuits so that their quiescent bias currents are constant over temperature. However when the quiescent bias currents are fixed at a specific level, high ambient temperature causes the gain in the RF devices to degrade. It is also possible make the quiescent bias current vary linearly with temperature, but linearly changing quiescent bias currents present problems at cold ambient temperature. For example, as the ambient temperature decreases the bias currents in the HBT decreases, causing amplifier linearity to degrade. Because integrated circuits (ICs) used in modern electrical systems operate over a range of temperatures, an HBT that reduces degradation of amplifier linearity would be useful.

BRIEF DESCRIPTION OF THE DRAWINGS

The present disclosure may be better understood, and its numerous features and advantages made apparent to those skilled in the art by referencing the accompanying drawings.

DESCRIPTION OF THE PREFERRED EMBODIMENT(S)

The present disclosure is generally directed towards systems and methods to control the linearity of an amplifier in order to reduce variations in signal quality that are affected by changes in temperature. Multiple bias circuits are utilized, and their outputs combined to produce a variable bias scheme. The present disclosure is better understood with respect to FIGS. 1–7.

Figure 1:
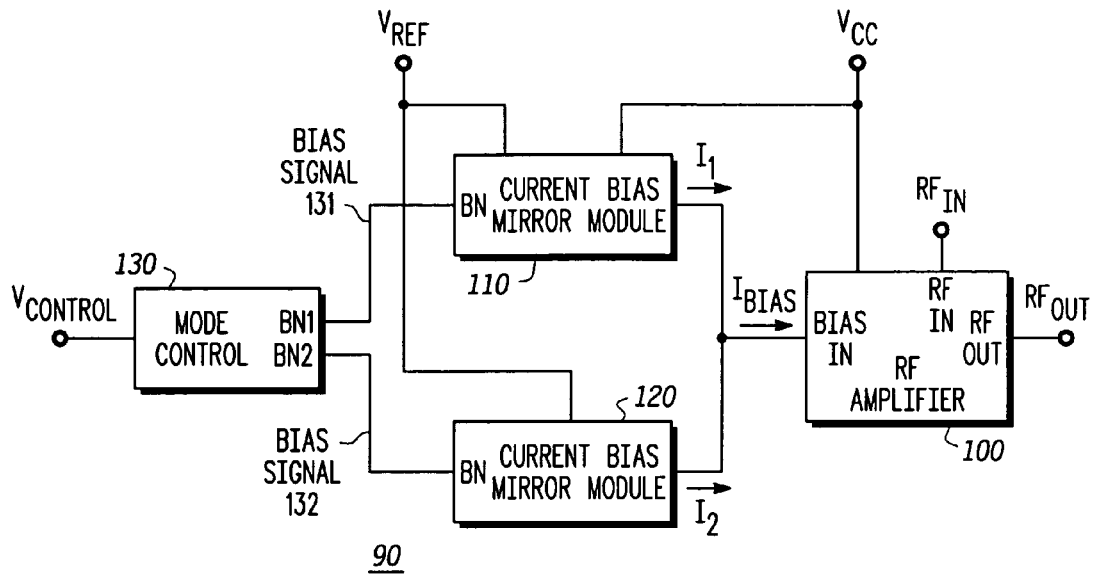
FIG. 1 is a block diagram illustrating a system according to one embodiment of the disclosure.

FIG. 1 illustrates in block diagram form a HBT Radio Frequency (RF) Amplifier Module System 90 in accordance with a specific embodiment of the present disclosure. The amplifier module 90 includes a RF Amplifier 100, a Current Bias Mirror Module 110, a Current Bias Mirror Module 120 and a Mode Control Module 130.

Mode Control Module 130 has an input to receive a control signal labeled $V_{CONTROL}$, and a pair of outputs, labeled BN1 and BN2, that provide signals labeled Bias Signal 131 and Bias Signal 132. In operation, Mode Control Module 130 receives signal $V_{CONTROL}$, and based upon the value of $V_{CONTROL}$ provides appropriate output signals for outputs BN1 and BN2.

Current Bias Mirror Module 110 has an input labeled BN to receive Bias Signal 131 provided by Mode Control Module 130. Current Bias Mirror Module 110 has an input labeled $V_{REF}$ coupled to receive a reference voltage $V_{REF}$, and an input connected to a supply voltage $V_{CC}$. $V_{REF}$ is typically regulated to the range of 2.75–2.85 volts, while $V_{CC}$ is typically based upon the voltage of a battery of a portable device. An output node of the Current Bias Mirror Module 110 provides a bias current labeled $I_1$, which may represent either a positive or negative contribution to the current labeled $I_{BIAS}$.

Current Bias Mirror Module 120 has an input labeled BN to receive Bias Signal 132 provided by Mode Control Module 130. Current Bias Mirror Module 120 has an input coupled to receive a reference voltage $V_{REF}$, and an input connected to a supply voltage $V_{CC}$. An output node of the Current Bias Mirror Module 120 provides a bias current labeled $I_2$, which may represent either a positive or negative contribution to the current labeled $I_{BIAS}$.

RF Amplifier 100, in the embodiment of FIG. 1, has three inputs and one output. One input node is labeled Bias In and receives the signal labeled $I_{BIAS}$, which is the summation of currents $I_1$ and $I_2$. Input node labeled RF In receives a signal labeled $RF_{IN}$. Another input node is connected to the supply voltage $V_{CC}$. RF Amplifier 100 has an output node labeled RF Out that provides a signal labeled $RF_{OUT}$.

In operation, the Mode Control Module 130 is controlled by the signal $V_{CONTROL}$, which is supplied from external system 90 of FIG. 1. $V_{CONTROL}$ indicates to Mode Control Module 130 an operating mode of the HBT RF Amplifier Module System 90. For example, in one embodiment, $V_{CONTROL}$ is a binary signal indicating whether the System 90 should be in a high-power or low-power state. In other embodiments, more than two modes can be selected. In yet another mode, the signal $V_{CONTROL}$ can be an analog signal that biases a transistor in its active region. The values of output signals of Mode Control 130, BIAS SIGNAL 131 and BIAS SIGNAL 132, are determined by a value of input $V_{CONTROL}$. In turn, signals BIAS SIGNAL 131 and BIAS SIGNAL 132 control the behavior of Current Bias Mirror Modules 110 and 120. More specifically, depending upon the value of $V_{CONTROL}$, which controls BIAS SIGNAL 131, Current Bias Mirror Module 110 will supply a specific amount of current $I_1$ at its output node. In like manner Current Bias Mirror Module 120 will supply a specific amount of current $I_2$ at its output node based on the value of $V_{CONTROL}$. It should be noted that currents $I_1$ and $I_2$ are not necessarily, and indeed usually will not be, equal. The magnitude of $I_1$ and $I_2$ currents will also vary with temperature in unique manners. It is this different behavior of the currents $I_1$ and $I_2$ that, when combined, provide the nonlinear signal $I_{BIAS}$. As a result of this non-linearity over temperature of $I_{BIAS}$, the signal output of the RF Amplifier has better linearity at low temperatures when compared to prior art amplifiers while maintaining good gain characteristics at elevated temperatures.

RF Amplifier 100 receives the signal $I_{BIAS}$ at node Bias In. RF Amplifier 100 also receives the signal $RF_{IN}$ via node RF In and amplifies it. An amplified representation of $RF_{IN}$, labeled $RF_{OUT}$, is output via node RF Out. The amplification of signal $RF_{IN}$ is controlled by the design of RF Amplifier 100, and depends upon the value of $I_{BIAS}$. The varying characteristics of signal $I_{BIAS}$ over temperature allow RF Amplifier 100 to have better linearity and gain across hot and cold temperatures when compared to prior art.

Figure 2:
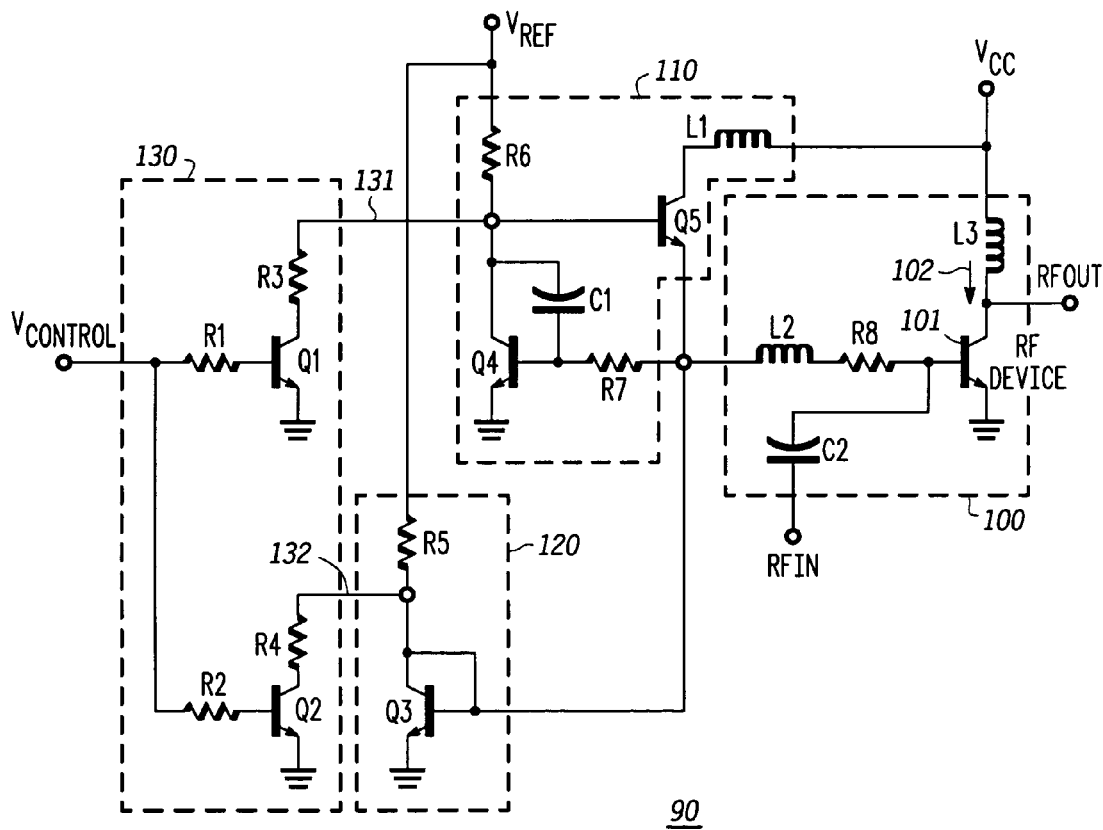
FIG. 2 is a schematic diagram that generally illustrates a specific embodiment of the disclosure.

FIG. 2 shows a more detailed view of HBT Radio Frequency (RF) Amplifier Module System 90. Mode Control Module 130 is illustrated to include four resistors labeled R1, R2, R3, and R4 and transistors Q1 and Q2. Resistor R1 has a first node connected to receive the signal $V_{CONTROL}$ and a second node connected to base of transistor Q1. Transistor Q1 has an emitter connected to a ground reference and a collector connected to a first node of resistor R3. Resistor R3 has a second node to provide BIAS SIGNAL 131. Resistor R2 has a first node connected to receive the signal $V_{CONTROL}$, and a second node connected to the base of transistor Q2. Transistor Q2 has an emitter connected to a ground reference and a collector connected to a first node of resistor R4. Resistor R4 has a second node to provide signal BIAS SIGNAL 132.

Current Bias Mirror Module 120 is illustrated to comprise a resistor R5 and a transistor Q3. Resistor R5 has a first node connected to voltage reference $V_{REF}$ and a second node connected to the second node of R4. Transistor Q3 comprises a collector connected to the second node of resistor R5. The base of transistor Q3 is connected to its own collector. The emitter of transistor Q3 is connected to a ground reference.

Current Bias Mirror Module 10 is illustrated to comprise resistors R6 and R7, transistors Q4 and Q5, capacitor C1 and inductor L1. Resistor R6 has a first node connected to the $V_{REF}$ voltage reference and a second node connected to the second node of R3. Resistor R7 has a first node connected to the base of transistor Q4 and a second node coupled to the emitter of transistor Q5. Transistor Q4 has an emitter connected to a ground reference, and a collector connected to the second node of resistor R6. Capacitor C1 has a first node connected to the base of transistor Q4 and a second node connected to the collector of Q4. Inductor L1 has a first node connected to the voltage source $V_{CC}$ and a second node connected to the collector of transistor Q5. The base of transistor Q5 is connected to the second node of resistor R6. The emitter of transistor Q5 is connected to the second node of resistor R7.

RF Amplifier Module 100 is illustrated to comprise resistor R8, Capacitor C2, Inductors L2 and L3 and RF Device 01. Inductor L3 has a first node connected to voltage reference $V_{CC}$ and a second node to provide signal $RF_{OUT}$. RF Device 101 is a transistor. The collector of RF Device 101 is connected to the second node of Inductor L3, the emitter of RF Device 01 is connected to a ground reference and the based of RF Device 101 is connected to a first node of R8. Capacitor C2 has a first node connected to the base of RF Device 101, and a second node connected to receive signal $RF_{IN}$. Resistor R8 has a second node connected to a first node of inductor L2. Inductor L2 has a second node connected to the second node of R7 and to the base of transistor Q3.

In operation, control signal $V_{CONTROL}$ is a biasing signal that determines the state (on/off) of transistors Q1 and Q2. These transistors in turn set the voltage level at the collector of Q4 and the collector of Q3 of Current Bias Mirror Modules 10 and 120, respectively, through the use of voltage divider circuitries R6/R3, which control the Current Bias Mirror Module 110, and R5/R4 which control Current Bias Mirror Module 120. Alternatively, $V_{CONTROL}$ could actively bias a transistor using an analog signal to control the current directly, or through the voltage divider circuits.

Current Bias Mirror Module 110 is a current mirror with a base current driver. This circuit provides a linear association between the magnitude of $I_1$, at the node common to Q5 emitter and R7, at the output of Module 110 and temperature. That is, the magnitude of the current $I_1$ increases as temperature increases. This increased bias current provided by Module 110 helps overcome the degradation in gain that is normally associated with RF devices at high temperatures. (In operation, the base-emitter junction voltage of HBT transistor Q4 decreases as temperature increases, while resistance values of resistors increase with temperature increases. In Module 110, base-emitter junction of Q4 is in series with R7, base-emitter junction of Q5, and R6. The voltage at the collector of transistor Q4 is dominated by Vbe of Q4 & Q5. When temperature increases, the voltage of second note of R6 decreases. As a result, the rate of voltage decrease at the second node of R6 is faster than the rate of resistance increase of R6, so collector current (dV6/dR6) of Q4 has a positive slope over temperature. $I_1$ is proportional to collector current of Q4. Thus, $I_1$ also has positive slope over temperature.

Current Bias Mirror Module 120 is a single rectifier current mirror. The output current $I_2$ of this circuit decreases as temperature increases above normal room temperature. The transfer function of $I_2$ is selected so that, when combined with current $I_1$ of Current Bias Mirror Module 110, the combination of currents which form $I_{BIAS}$ exhibit less variation at low temperatures while allowing greater variation at high temperatures. The greater variation at high temperatures compensates for gain degradation. The end result on $I_{BIAS}$ is that the magnitude of $I_{BIAS}$ decreases at a slower rate as the temperature transitions below normal room temperature. R5 value is selected so that the voltage at second node connected to R5 and R4 is dominated by R5. The collector current of Q3 decreases when temperature increases so that $I_2$ also decreases. By adjusting the ratio of R5 and R6, the slope of $I_2$, and thus $I_{BIAS}$, can be adjusted over temperature.

The currents $I_1$ and $I_2$ that are output from the Current Bias Mirror Modules 110 and 120 combine to form the signal called $I_{BIAS}$. $I_{BIAS}$ exhibits characteristics of both of its components. For temperatures above normal room temperature, $I_{BIAS}$ increases as the temperature increases, providing extra bias current to RF Amplifier Module 100 in order to overcome gain degradation at high temperatures. For temperatures below normal room temperature $I_{BIAS}$ decreases or remains constant as the temperature decreases in a less pronounced manner. That is, the change in current per change in temperature is greater when the temperature is above normal room temperature than when it is below normal room temperature. The Collector Current 102 which flows through RF Device 101 is dependent upon the magnitude of $I_{BIAS}$.

Figure 3:
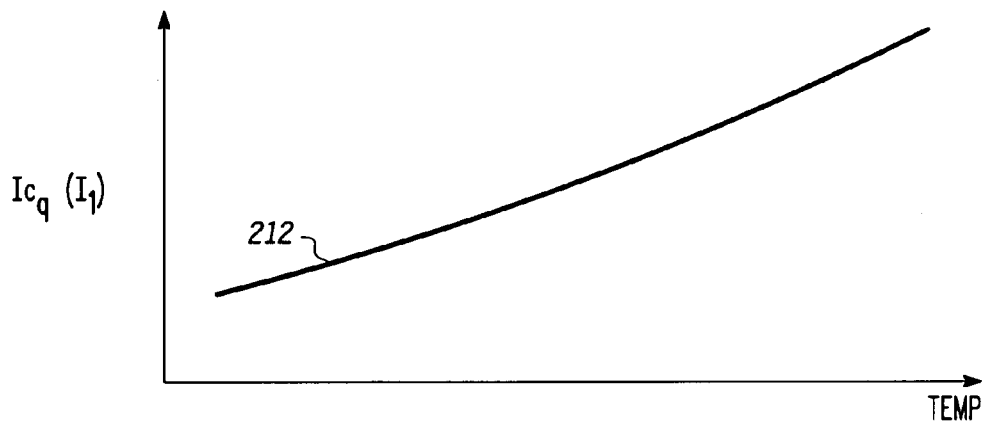
FIG. 3 is a graph illustrating the property of the quiescent collector current based on a portion $I_1$ of the base current in accordance with a specific embodiment of the present disclosure.

FIG. 3 illustrates a graph of Icq ($I_1$) vs. temperature, where Icq ($I_1$) is that portion of collector current 102, in a quiescent state, that is attributed to the $I_1$ portion of base current $I_{BIAS}$. As ambient temperature increases, the magnitude of quiescent current due to $I_1$, represented by the graph line 212 in FIG. 3, also increases monotonically, thereby providing line 212 with a slope polarity that is positive. The increasing magnitude of graph line 212 as temperature rises acts to overcome the degradation in gain of the RF Amplifier Module 100 which would otherwise occur at elevated temperatures.

Figure 4:
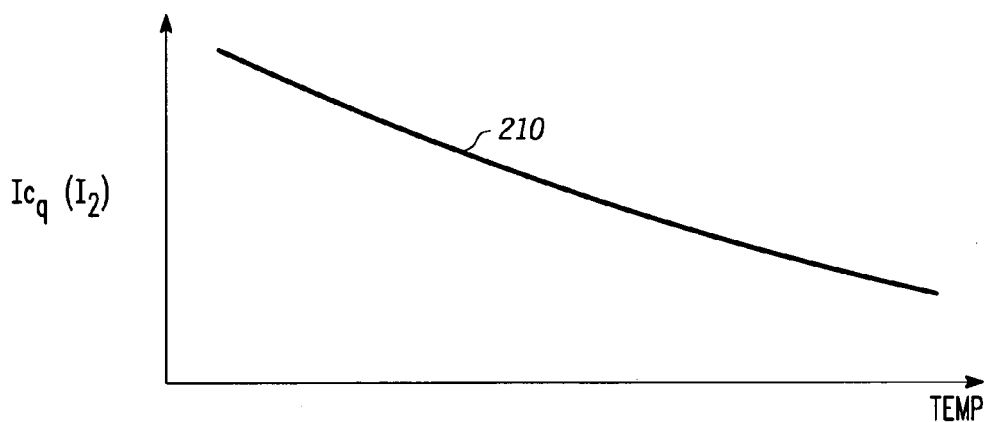
FIG. 4 is a graph illustrating the property of quiescent collector current based on a portion $I_2$ of the base current in accordance with a specific embodiment of the present disclosure.

FIG. 4 illustrates a graph of Icq ($I_2$) vs. temperature, where Icq ($I_2$) is that portion of collector current 102, in a quiescent state, that is attributed to the $I_2$ portion of base current $I_{BIAS}$. In a similar but opposite manner as $I_1$, the magnitude of current $I_2$, represented by the graph line 210 in FIG. 4, decreases monotonically as ambient temperature increases, thereby providing line 210 with a slope polarity that is negative. This serves to moderate the overall change in $I_{BIAS}$ at lower temperatures.

Figure 5:
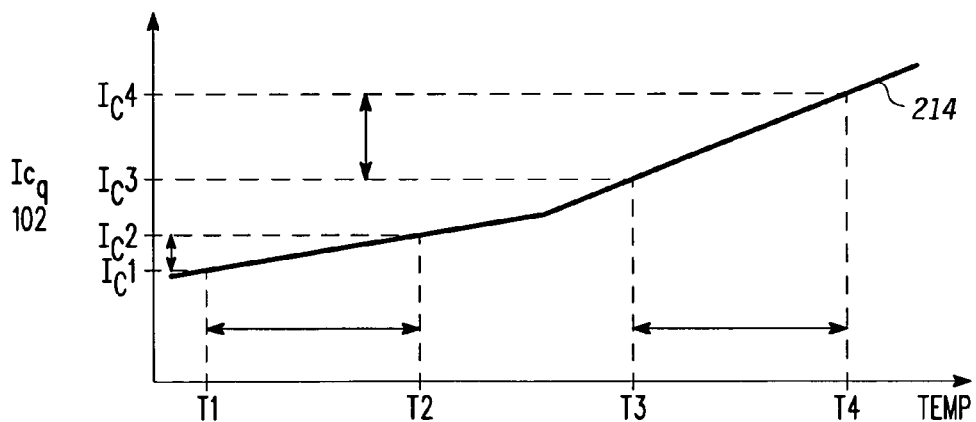
FIG. 5 illustrates the combined quiescent collector currents of FIG. 3 and FIG. 4 in accordance with a specific embodiment of the present disclosure.

FIG. 5 is a graph illustrating the varying slope of the quiescent bias current 102 over the full range of operating temperatures. The quiescent current Icq is based on the base current $I_{BIAS}$, which is the summation of currents $I_1$ and $I_2$. As illustrated, the current 102 has a greater increase in magnitude per change in unit temperature at elevated temperatures as compared to lower temperatures. In one embodiment, $I_{BIAS}$ level and slope is set by adjusting R3, R4, R5, and R6. In one embodiment, as FIG. 5 shows, R5 and R6 are set so that the slope of $I_{BIAS}$ from $T_1$ (−20° C.) to $T_2$(20° C.) is about 0.01 mA/° C. and the slope of $I_{BIAS}$ from $T_3$ (40° C.) to $T_4$(80° C.) is about 0.2 mA/° C. when $V_{CONTROL}$ is setup for high power state. R3 and R4 are further set so that the slope of $I_{BIAS}$ from $T_1$ (−20° C.) to $T_2$ (20° C.) is about 0.01 mA/° C. and the slope of $I_{BIAS}$ from $T_3$(40° C.) to $T_4$(80° C.) is about 0.15 mA/° C. when $V_{CONTROL}$ is setup for low power state.

Component values for a specific embodiment are listed in the table below.

| | |
|---|---|
| R1 = | 5 kohms |
| R2 = | 5 kohms |
| R3 = | 2.8 kohms |
| R4 = | 2.6 kohms |
| R5 = | 1.55 kohms |
| R6 = | 400 ohms |
| R7 = | 750 ohms |
| R8 = | 12.5 ohms |
| Transistor 101 = | 5400 square microns |
| Q1 = | 30 square microns |
| Q2 = | 30 square microns |
| Q3 = | 45 square microns |
| Q4 = | 90 square microns |
| Q5 = | 120 square microns |
| L1 = | 5 nH |
| L2 = | 5 nH |
| L3 = | 5 nH |
| C1 = | 7 pF |
| C2 = | 12 pF |

Figure 6:
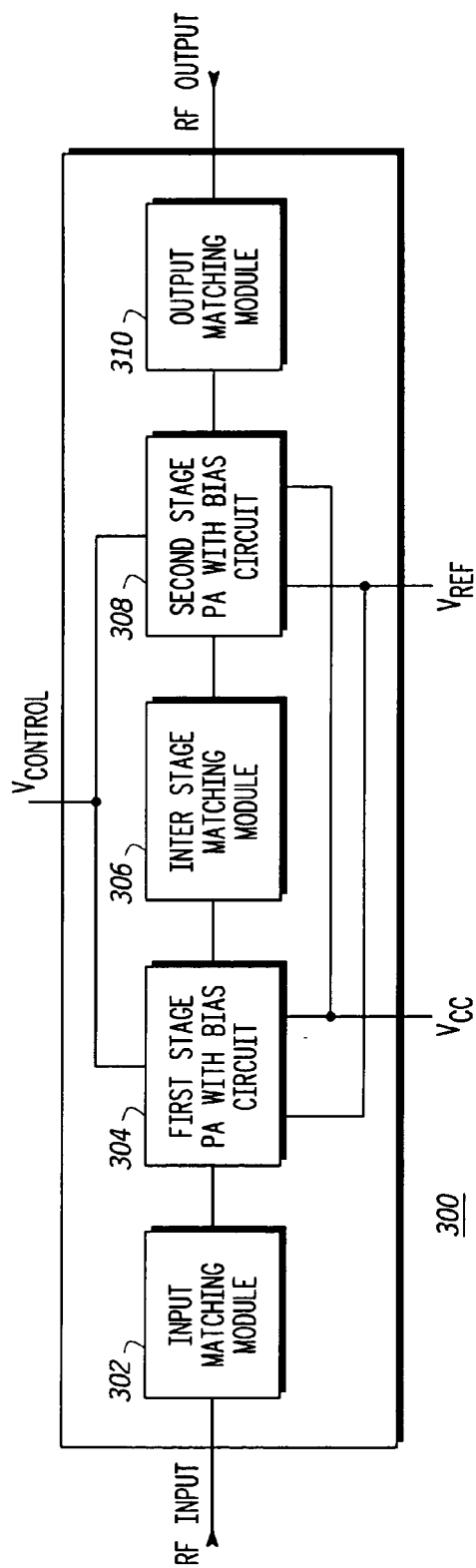
FIG. 6 illustrates an RF amplifier module in accordance with the present disclosure.

FIG. 6 illustrates a complete RF Amplifier Module 300 incorporating several submodules, some of which include the bias compensation techniques of the present disclosure. RF Amplifier Module 300 contains an input node to receive RF Input signal at a first node of the Input Matching Module 302. Input Matching Module 302 has a second node which connects to a first node of 1$^{st}$ Stage Power Amplifier with Bias Circuit 304. 1$^{st}$ Stage Power Amplifier with Bias Circuit 304 has a second node which connects to a first node of Interstage Matching Module 306. Interstage Matching Module 306 has a second node which connects to a first node of 2$^{nd}$ Stage PA with Bias Circuit 308. 2$^{nd}$ Stage Power Amplifier with Bias Circuit 308 has a second node which connects to a first node of Output Matching Module 310. Output Matching Module 310 has a second node which connects to an output node to provide a signal labeled RF Output. Stages 304 and 308 can be implemented specifically based on the systems of FIG. 1.

In operation FIG. 6 receives a low-level RF signal RF Input and amplifies it. The amplified output is produced at the output node as RF Output. 1$^{st}$ Stage Power Amplifier with Bias Circuit 304 and 2$^{nd}$ Stage Power Amplifier with Bias Circuit 308 provide the signal amplification, while the remaining modules 302, 304, and 310 provide low-distortion connections between the amplification stages and the input and output. 1$^{st}$ Stage PA with Bias Circuit 304 and 2$^{nd}$ Stage PA with Bias Circuit 308 each contain bias circuitry as described in the present disclosure.

Figure 7:
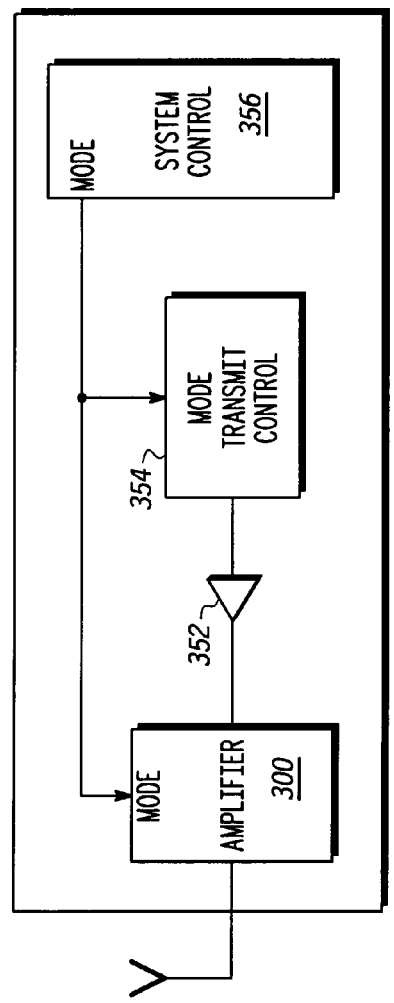
FIG. 7 illustrates a system incorporating the power amplifier of FIG. 6 in accordance with a specific embodiment of the present disclosure.

FIG. 7 illustrates a System 350 incorporating a Power Amplifier 300 as described in FIG. 6 with additional modules to comprise a more complete representation of a system such as a mobile or base station transceiver. System 350 comprises an antenna input connected to a first node of RF Amplifier 300. RF Amplifier 300 has a second node which connects to the output node of buffer 352. RF Amplifier 300 has a third node labeled MODE, which functions in a manner similar to the signal $V_{CONTROL}$ described in FIGS. 1 and 2. Buffer 352 has an input node which connects to a first node of Transmit Control 354. Transmit Control 354 has a second node, labeled MODE, which is connected to the node on RF Amplifier 300 also identified as MODE. The remaining block of System 350 is labeled System Control 356. System Control 356 has a single output node which connects to the MODE inputs of RF Amplifier Module 300 and Transmit Control 354.

In operation, System 350 controls transmission of RF signals. System Control 356 provides the MODE signal to Transmit Control 354 and RF Amplifier 300 so that the RF output from module 300 to the antenna is amplified to an appropriate, predetermined level. The Transmit Control 354 controls the input power to Amplifier 300 to maintain a desired output power level of power amplifier 300.

In the preceding detailed description of the preferred embodiments, reference has been made to the accompanying drawings, which form a part thereof, and in which is shown by way of illustration specific preferred embodiments in which the invention may be practiced. These embodiments are described in sufficient detail to enable those skilled in the art to practice the invention, and it is to be understood that other embodiments may be utilized and that logical and electrical changes may be made without departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present invention is defined only by the appended claims.

What is claimed is:

1. A device comprising:
    a radio frequency amplifier comprising a RF input, a bias node, and a RF output;
    a first current mirror module comprising a first bias node coupled to the bias node;

a second current mirror module comprising a first bias node coupled to the first bias node of the first current mirror module; and a mode control module comprising a first bias node coupled to a second bias node of the first current mirror module, and a second bias node coupled to a second bias node of the second current mirror module, and an input to receive a signal indicating one of a high power state and a low-power state.

2. The device of claim 1, wherein the second current mirror module further comprises a single p-n junction current mirror.

3. The device of claim 2, wherein the single p-n junction current mirror further comprises a transistor having a first current node, a second current node, and a control node coupled to the first current node.

4. The device of claim 3, wherein the first current mirror comprises
- a first transistor comprising a first current electrode, a second current electrode coupled to the first bias node of the first current mirror, and a control node;
- a second transistor comprising a first current electrode coupled to the control node of the first transistor, a second current electrode, and a control electrode coupled to the second current electrode of the first transistor.

5. The device of claim 4, wherein the second current electrode of the first transistor is connected to the first bias node.

6. The device of claim 5 wherein the second bias node of the of the first current module is coupled to the first current node of the second transistor.

7. The device of claim 5 wherein the second bias node of the of the second current module is coupled to the first current node of the transistor of the single rectifier.

8. The device of claim 7 wherein the mode control module further comprises a first transistor comprising a first current electrode coupled to the first bias node of the mode control module, a second current electrode, and a control node.

9. The device of claim 8 wherein the mode control module further comprises a second transistor comprising a first current electrode coupled to the second bias node of the mode control module, a second current electrode, and a control node coupled to the control node of the first transistor of the mode control module.

10. A method comprising the steps of:
facilitating generation of a first portion of a control node bias current at a first current source, where a slope of a quiescent current versus temperature attributed to the first portion of the control node bias current has a first polarity; and
facilitating generation a second portion of the control node bias current at a second current source, where a slope of a quiescent current versus temperature attributed to the second portion of the control node bias current has a second polarity opposite the first polarity.

11. The method of claim 10 further comprising:
selecting a mode of operation, wherein a magnitude of the node bias current is based upon the mode of operation.

12. A method comprising the steps of:
providing to a base of an RF amplifier, a first bias current to generate a collector current at the RF amplifier that varies by less than a first rate with respect to temperature when operating within a first temperature range; and
providing to the base of the RF amplifier, a second bias current to generate a collector current at the RF amplifier that varies by greater than a second rate with respect to temperature when operating within a second temperature range, a minimum value of the second rate with respect to the second temperature range being larger than a maximum value of the first temperature range.

13. The method of claim 12, wherein a maximum temperature of the first 30 degree temperature range is less than 20 degrees Celsius.

14. The method of claim 13, wherein a minimum temperature of the second 30 degree temperature range is greater than 20 degrees Celsius.

15. The method of claim 14, wherein the first rate with respect to temperature is 1 milliamp per 7 degrees Celsius.

16. The method of claim 12, wherein the first rate with respect to temperature is 1 milliamp per 7 degrees Celsius.

17. The method of claim 12, wherein a minimum temperature of the second 30 degree temperature range is greater than 20 degrees Celsius.

18. The method of claim 12 further comprising:
providing a mode indicator, wherein a magnitude of the first bias current and a magnitude of the second bias current are based on the mode indicator.

19. A device comprising:
an input matching module comprising a first input node to receive an RF signal, and an output;
a first stage power amplifier comprising:
- a radio frequency amplifier comprising a RF input, a bias node coupled to the output of the input matching module, and a RF output;
- a first current mirror module comprising a first bias node coupled to the bias node; and
- a second current mirror module comprising a first bias node coupled to the first bias node of the first current mirror module;
an interstage matching module comprising an input coupled to the RF output of the first stage amplifier, and an output; and
a second stage power amplifier comprising:
- a radio frequency amplifier comprising a RF input, a bias node coupled to the output of the interstage matching module, and a RF output;
- a first current mirror module comprising a first bias node coupled to the bias node; and
- a second current mirror module comprising a fast bias node coupled to the first bias node of the first current mirror module.

20. The device of claim 19, wherein the device is an RF base station transceiver further comprising a system control module coupled to the first and second stage power amplifiers.

21. The device of claim 19, wherein the device is an RF mobile transceiver further comprising a system control module coupled to the fast and second stage power amplifiers.

* * * * *

UNITED STATES PATENT AND TRADEMARK OFFICE
CERTIFICATE OF CORRECTION

PATENT NO. : 7,057,462 B2  Page 1 of 1
APPLICATION NO. : 10/857040
DATED : June 6, 2006
INVENTOR(S) : Li-Hung Kang et al.

It is certified that error appears in the above-identified patent and that said Letters Patent is hereby corrected as shown below:

Column No. 8, Line No. 50 change "fast" to --first--

Column No. 8, Line No. 59 change "fast" to --first--

Signed and Sealed this

Fifth Day of December, 2006

JON W. DUDAS
*Director of the United States Patent and Trademark Office*